FREQUENCY STABILIZED OSCILLATOR

Filed June 1, 1967

INVENTOR
H. SEIDEL
BY
Sylvan Sherman
ATTORNEY

United States Patent Office 3,401,354
Patented Sept. 10, 1968

3,401,354

FREQUENCY STABILIZED OSCILLATOR

Harold Seidel, Warren Township, Somerset County, N.J., assignor to Bell Telephone Laboratories, Incorporated, Berkeley Heights, N.J., a corporation of New York Filed June 1, 1967, Ser. No. 642,871
3 Claims. (Cl. 331—46)

ABSTRACT OF THE DISCLOSURE

This application describes signal sources whose frequencies are substantially independent of temperature. The invention is particularly adapted to crystal-controlled oscillators.

In accordance with the invention, two or more resonators are combined in a manner such that the temperature sensitivities of the individual resonators are collectively compensated. In one embodiment of the invention, the resonators are piezoelectric crystals used as idler circuits in a parametric oscillator. In a second embodiment of the invention, a plurality of separate oscillators are coupled to a common nonlinear impedance. The number of idler circuits (or oscillators) used is one more than the order of correction sought.

The output frequency is equal to the algebraic sum of the crystal (oscillator) frequencies, where the frequencies are computed by individually summing to zero each of the $n$ order frequency deviations for the $n+1$ crystals (oscillators).

This invention relates to frequency stabilized oscillators.

*Background of the invention*

The stabilizing effect of a piezoelectric crystal on an electronic oscillator is well known. It is equally well known, however, that a crystal's frequency is temperature sensitive, and, as a consequence, means, such as an oven, are advantageously provided to maintain the crystal temperature constant. More generally, variations in temperature affect the stability of any resonant structure insofar as such temperature changes produce changes in the physical dimensions of the resonator and corresponding changes in its resonant frequency.

*Summary of the invention*

In accordance with the present invention, oscillators having improved frequency stability are realized by combining two or more resonators in a manner such that the temperature sensitivities of the individual resonators are collectively compensated.

In the first embodiment of the invention, to be described in greater detail hereinbelow, the resonators are piezoelectric crystals, used as idler circuits in a parametric oscillator configuration. In particular, it is shown that $n$th order correction can be obtained by the use of $n+1$ crystal-controlled idler circuits. A broadband, $n+2$nd idler circuit is included to minimize the stability requirements on the pump source whose frequency, in accordance with well established practice, is equal to the sum of the idler frequencies.

The oscillator output frequency is equal to the algebraic sum of the crystal frequencies, where the latter are computed by individually summing to zero each of the $n$ order frequency deviations for the $n+1$ crystals.

In a second embodiment of the invention, the crystals are associated with separate oscillators which are coupled to a common nonlinear impedance. The criteria for frequency stability are the same as defined above.

It is an advantage of the invention that the oscillator output frequency is no longer a function of the absolute temperature of the crystals and, hence, the need for an oven is minimized. However, since temperature differences among the crystals can affect the output frequency, the crystals are advantageously placed close together, within a thermally conducting enclosure.

These and other objects and advantages, the nature of the present invention, and its various features, will appear more fully upon consideration of the various illustrative embodiments now to be described in detail in connection with the accompanying drawings.

*Brief description of the drawings*

Referring to the drawings, FIG. 1 shows a generalized crystal-controlled parametric oscillator in accordance with the invention. The oscillator comprises the usual components including a pump source 10 connected in series with a non-linear reactance 11, shown as a varactor diode, an idler circuit network 12 comprising a plurality of $n+2$ circuits, and an output circuit 13.

In general, the oscillator operates in accordance with those well establishesd frequency and amplitude requirements for parametric operation. That is, the frequency, $f_p$, of the pump source is equal to the sum of the idler frequencies, while the amplitude of the pump signal is such as to exceed the threshold level for oscillations. (For a detailed discussion of the operation of a varactor parametric oscillator, see "The Variable-Capacitance Parametric Amplifier," published in the October 1959 Bell Laboratories Record, vol. 37, No. 10, pages 373–379.)

The present invention is particularly concerned with the details of the idler circuit 12 and of the output circuit 13.

As was mentioned hereinabove, the frequency characteristic of a piezoelectric crystal is temperature sensitive. This sensitivity can be expressed, most generally, for each of the $n+1$ crystals as $$\Delta f_c/f_c = s_{cn}(\Delta T)^n + s_{cn-1}(\Delta T)^{n-1} \ldots s_{c1}(\Delta T) \quad (1)$$

where $\Delta f_c/f_c$ is the normalized change in frequency of the $c$th crystal for a change in temperature $\Delta T$ about some specified reference temperature. The particular values of the coefficients $s_{cn} \ldots s_{c1}$ depend, among other things, upon the cut of the crystal and upon the crystal material. For a discussion of crystals and their temperature dependency see "Quartz Crystal Units Oscillatory Circuitry Precise Frequency Control," Whippany Electronics Conference, September 1956, published by the Bell Telephone Laboratories, Incorporated, Whippany, N.J. Also see "Piezocrystals and Their Application to Ultrasonics" by W. P. Mason, D. Van Nostrand Company, Inc., Princeton, N.J.)

In accordance with the present invention, a plurality of crystals are used in a manner to mutually compensate for the temperature dependency of the several individual crystals. The number of crystals that are used depends upon the order of correction required. In general, to correct frequency deviations up to the $n$th order requires $n+1$ crystals.

Figure 1:
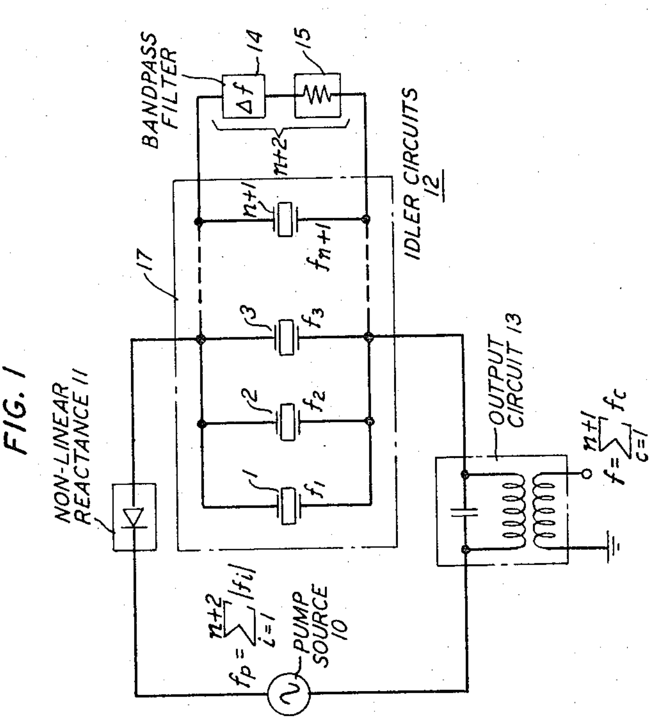
FIG. 1 shows a crystal-controlled parametric oscillator in accordance with the invention.

However, for purposes of illustration, let us assume that only first and second order correction is required. Such a crystal-controlled oscillator would require four idler circuits of which three were crystals. Referring to FIG. 1, $n$, which indicates the order of correction is 2 and, hence, there are $n+1$, or three crystals, 1, 2 and 3, tuned, respectively, to frequencies $f_1$, $f_2$ and $f_3$. The $n+2$nd, or fourth idler circuit, comprises a bandpass filter 14 and a dissipative load 15. The reason for including this fourth idler circuit is discussed in greater detail hereinbelow.

The three equations setting forth the normalized frequency-temperature characteristic of the respective crystals are given as $$\Delta f_1/f_1 = s_{11}\Delta T + s_{12}(\Delta T)^2 \qquad (2)$$

$$\Delta f_2/f_2 = s_{21}\Delta T + s_{22}(\Delta T)^2 \qquad (3)$$

$$\Delta f_3/f_3 = s_{31}\Delta T + s_{32}(\Delta T)^2 \qquad (4)$$

In order that the net first order frequency variations of the three crystals, given by coefficients $s_{11}$, $s_{21}$ and $s_{31}$ mutually cancel, it is required that $$s_{11}f_1 + s_{21}f_2 + s_{31}f_3 = 0 \qquad (5)$$

Similarly, the mutual cancellation of second order effects requires that $$s_{12}f_1 + s_{22}f_2 + s_{32}f_3 = 0 \qquad (6)$$

Finally, the output frequency, $f$, in accordance with the invention, is made equal to the algebraic sum of the three crystal frequencies. That is $$f = \sum_{c=1}^{n+1} f_c = f_1 + f_2 + f_3 \qquad (7)$$

where $f_c$ is the frequency of the $c$th crystal.

Since the desired output frequency $f$ and the crystal coefficients are known, the three Equations 5, 6 and 7 can be solved for the three crystal frequencies $f_1$, $f_2$ and $f_3$. This solution gives the frequencies of the three crystal idler circuits to produce a constant output frequency, $f$, over the temperature range for which the temperature-frequency relationships defined by Equations 2, 3 and 4 are descriptive of the crystals. It should be noted that this output frequency is independent of the absolute temperature of the crystals. However, it is affected by changes in the relative temperatures of the crystals. Accordingly, the crystals are advantageously placed close to each other and within a thermally conducting enclosure 17.

The fourth idler circuit, represented by filter 14 and load 15, is included in order to accommodate variations in the frequency of the pump source. Since the crystals are very narrow band, means must be provided whereby the frequency requirement for parametric operation, given by $$f_p = \sum_{i=1}^{n+2} |f_i| = \sum_{c=1}^{3} |f_c| + f_4 \qquad (8)$$

remains satisfied regardless of variations in the pump frequency. Since, in Equation 8, $f_4$ can be any frequency within the passband of filter 14, the oscillator remains operative over a range of pump frequencies coextensive with the bandwidth $\Delta f$ of filter 14. Such an arrangement greatly relaxes the requirements upon the frequency stability of the pump source without, in any way, affecting the frequency stability of the output signal.

The relationships given above for the three crystal oscillators can be generalized for any number of crystals. Expressing the frequency-temperature characteristic of the $c$th crystal as $$\frac{\Delta f_c}{f_c} = \sum_{j=1}^{n} s_{cj}(\Delta T)^j \qquad (9)$$

$n$th order stabilization is obtained when $$\left.\begin{aligned} 0 &= \sum_{c=1}^{n+1} f_c s_{c1} \\ 0 &= \sum_{c=1}^{n+1} f_c s_{c2} \\ &\cdots\cdots \\ 0 &= \sum_{c=1}^{n+1} f_c s_{cn} \end{aligned}\right\} \qquad (10)$$

The output frequency, equal to the algebraic sum of the crystal frequencies, is given by $$f = \sum_{c=1}^{n+1} f_c \qquad (11)$$

The pump frequency is equal to the sum of the idler frequencies, $f_i$, or $$f_p = \sum_{i=1}^{n+2} |f_i| \qquad (12)$$

In terms of the crystal frequencies, and the noncrystal idler frequency, $f_{n+2}$, $$f_p = \sum_{c=1}^{n+1} |f_c| + f_{n+2} \qquad (13)$$

where $f_{n+2}$ is any frequency within the passband of filter 14.

For a two crystal system, providing only first order corrections, the crystal frequencies are $$f_1 = \frac{-s_{21}f}{s_{11} - s_{21}} \qquad (14)$$

and $$f_2 = \frac{s_{11}f}{s_{11} - s_{21}} \qquad (15)$$

The output frequency is $$f = \sum_{c=1}^{2} f_c = f_1 + f_2 \qquad (16)$$

and the pump frequency is $$f_p = \sum_{i=1}^{3} |f_i| = |f_1| + |f_2| + |f_3| \qquad (17)$$

Figure 2:
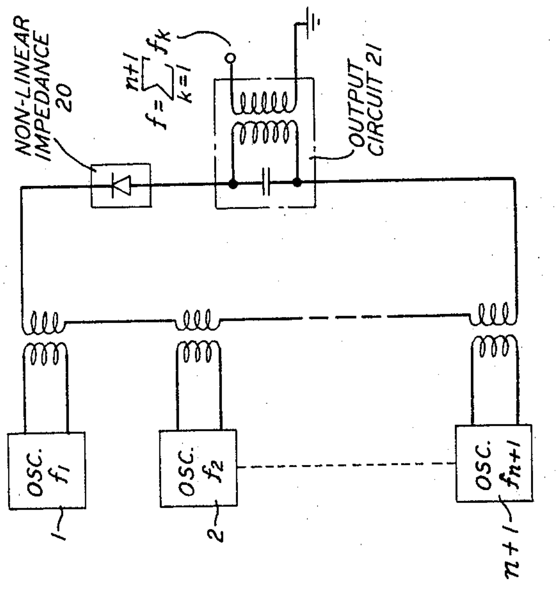
FIG. 2 shows a second embodiment of the invention using separate oscillators.

FIG. 2 shows a second embodiment of the invention in which a plurality of $n+1$ separate oscillators are suitably coupled to a common nonlinear reactance 20. As in the embodiment of FIG. 1, the normalized frequency-temperature dependency of each of the oscillators can be expressed by $$\frac{\Delta f_k}{f_k} = \sum_{j=j}^{n} s_{kj}(\Delta T)^j \qquad (18)$$

where $f_k$ is the frequency of the $k$th oscillator. The latter, and the frequency, $f$, to which the output circuit 21 is tuned are determined, as above, by the simultaneous solution of Equations 10 and 11. Unlike the embodiment of FIG. 1, however, no pump signal is required for the overall circuit.

Since the overall stability of the oscillator depends upon the stability of the individual oscillators, each of the oscillators is, advantageously, crystal controlled.

It is implicit in the above discussion that each crystal and each oscillator, in the two embodiments described, operates at one of the frequencies $f_1, f_2 \ldots f_{n+1}$ dictated by the simultaneous solution of Equations 10 and 11. However, it will be recognized that the normalized frequency-temperature relationship given by Equation 9 (or by Equation 18 for the oscillators of FIG. 2) can also be written as $$\frac{\Delta f_c/m_c}{f_c/m_c} = \sum_{j=1}^{n} s_{cj}(T)^j \qquad (19)$$

where $m_c$ is any integer. The implication is that any or all of the crystals (or oscillators) can, alternatively be tuned and operated at a subharmonic of the frequencies $f_1, f_2 \ldots f_{n+1}$, obtained from the solution of Equations 10 and 11, and the corresponding harmonic thereof used to generate the frequency actually needed to satisfy these equations. That is, the operating frequencies of the crystals of FIG. 1 and the oscillators of FIG. 2 are more generally given by $f_1/m_1, f_2/m_2 \ldots f_{n+1}/m_{n+1}$, where $m_1, m_2 \ldots m_{n+1}$ are integers. Thus, in all cases it is understood that the above-described arrangements are illustrative of but a small number of the many possible specific embodiments which can represent applications of the principles of the invention. Numerous and varied other arrangements can readily be devised in accordance with these principles by those skilled in the art without departing from the spirit and scope of the invention.

I claim:

1. A crystal-controlled parametric oscillator comprising:

a nonlinear reactance and a plurality of $(n+1)$ crystal controlled idler circuits tuned, respectively, to crystal frequencies $f_1/m_1$, $f_2/m_2$, $$f_3/m_3 \ldots f_{n+1}/m_{n+1}$$

where $m_1, m_2 \ldots m_{n+1}$ are integers;

each of said crystals having a normalized frequency-temperature characteristic defined by the relationship $$\frac{\Delta f_c/m_c}{f_c/m_c}=\sum_{j=1}^{n} s_{cj}(\Delta T)^j$$

where $$\frac{\Delta f_c/m_c}{f_c/m_c}$$

is the normalized change in frequency of the $c$th crystal for a given change in temperature $\Delta T$, and the coefficients $s_{cj}$ depend upon the physical properties of the $c$th crystal;

means for extracting wave energy from said oscillator at a given frequency, $f$, equal to the algebraic sum of frequencies $f_1, f_2, f_3 \ldots f_{n+1}$, where said frequencies are obtained by the simultaneous solution of the following $n+1$ equations;

$$f=\sum_{c=1}^{n+1} f_c$$

$$0=\sum_{c=1}^{n+1} f_c s_1$$

$$0=\sum_{c=1}^{n+1} f_c s_2$$

$$\ldots$$

$$0=\sum_{c=1}^{n+1} f_c s_{cn}$$

an $n+2$nd idler circuit comprising a bandpass filter and a dissipative load;

and means for pumping said oscillator at a pump frequency, $f_p$, equal to the sum of the idler frequencies, given by $$f_p=\sum_{i=1}^{n+2}|f_i|=\sum_{c=1}^{n+1}\left|\frac{f_c}{m_c}\right|+f_{n+2}$$

where $f_{n+2}$ is any frequency within the passband of said filter, and $m_c$ is an integer.

2. The oscillator according to claim 1 wherein $n=1$, and the crystal frequencies are $$\frac{f_1}{m_1}=\left[\frac{-s_{21}f}{s_{11}-s_{21}}\right]\cdot\frac{1}{m_1}$$

and $$\frac{f_2}{m_2}=\left[\frac{s_{11}f}{s_{11}-s_{21}}\right]\cdot\frac{1}{m_2}$$

where $m_1$ and $m_2$ are integers.

3. A frequency-stabilized oscillator comprising:

a plurality of $n+1$ individual oscillators tuned to frequencies $f_1/m_1$, $f_2/m_2 \ldots f_{n+1}/m_{n+1}$ and coupled to a common nonlinear impedance, where $m_1$, $m_2 \ldots m_{n+1}$ are integers;

each of said individual oscillators having a frequency-temperature characteristic defined by the relationship $$\frac{\Delta f_k}{f_k}=\sum_{j=1}^{n} s_{kj}(\Delta T)^j$$

where $\Delta f_k/f_k$ is the normalized change in frequency of the $k$th oscillator for a given change in temperature $\Delta T$, and the coefficients $s_{kj}$ depend upon the properties of the $k$th oscillator;

and means for extracting wave energy from said oscillator at a given frequency, $f$, equal to the algebraic sum of frequencies $f_1, f_2 \ldots f_{n+1}$ where said frequencies are obtained by the simultaneous solution of the following equations:

$$f=\sum_{k=1}^{n+1} f_k$$

$$0=\sum_{k=1}^{n+1} f_k s_{k1}$$

$$0=\sum_{k=1}^{n+1} f_k s_{k2}$$

$$\ldots$$

$$0=\sum_{k=1}^{n+1} f_k s_{kn}$$

No references cited.

JOHN KOMINSKI, *Primary Examiner.*